United States Patent
Yamazaki et al.

(10) Patent No.: US 6,499,427 B1
(45) Date of Patent: Dec. 31, 2002

(54) PLASMA CVD APPARATUS

(75) Inventors: Shunpei Yamazaki, Tokyo (JP); Toru Takayama, Kanagawa (JP); Mitsunori Sakama, Kanagawa (JP); Hisashi Abe, Chiba (JP); Hiroshi Uehara, Kanagawa (JP); Mika Ishiwata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/935,660

(22) Filed: Aug. 24, 2001

Related U.S. Application Data

(62) Division of application No. 09/069,942, filed on Apr. 30, 1998, now Pat. No. 6,283,060.

(30) Foreign Application Priority Data

May 9, 1997 (JP) ............................................. 9-136092

(51) Int. Cl.$^7$ ............................................ C23C 16/509

(52) U.S. Cl. .............. 118/723 E; 118/719; 156/345.31; 156/345.32

(58) Field of Search .............................. 118/723 R, 719, 118/725, 723 E; 216/67; 29/25.01; 156/345.31, 345.32

(56) References Cited

U.S. PATENT DOCUMENTS

| | | | |
|---|---|---|---|
| 4,647,512 A | * | 3/1987 | Venkataramanan et al. . 427/577 |
| 4,652,318 A | | 3/1987 | Masuda et al. .............. 250/324 |
| 4,951,601 A | | 8/1990 | Maydan et al. ............. 118/719 |
| 5,186,718 A | | 2/1993 | Tepman et al. ............. 29/25.01 |
| 5,308,417 A | | 5/1994 | Groechel et al. .............. 216/67 |
| 5,352,294 A | | 10/1994 | White et al. ................. 118/725 |
| 5,366,585 A | | 11/1994 | Robertson et al. .............. 134/1 |
| 5,779,803 A | | 7/1998 | Kurono et al. .......... 118/723 R |
| 6,352,593 B1 | * | 3/2002 | Brors et al. .................. 118/641 |

* cited by examiner

Primary Examiner—Gregory Mills
Assistant Examiner—Rudy Zervigon
(74) Attorney, Agent, or Firm—Eric J. Robinson; Robinson Intellectual Property Law Office, P.C.

(57) ABSTRACT

In a plasma CVD apparatus, unnecessary discharge such as arc discharge is prevented, the amount of particles due to peeling of films attached to a reaction chamber is reduced, and the percentage of a time contributing to production in hours of operation of the apparatus is increased while enlargement of the apparatus and easy workability are maintained. The plasma CVD apparatus is configured such that in a conductive reaction chamber 104 with a power source 113, a vacuum exhausting means 118, and a reaction gas introduction pipe 114, plasma 115 is generated in a space surrounded by an electrode 111, a substrate holder 112, and an insulator 120.

10 Claims, 4 Drawing Sheets

PLASMA CVD APPARATUS

Division of prior application Ser. No. 09/069,942 filed Apr. 30, 1998 now U.S. Pat. No. 6,283,060.

BACKGROUND OF THE INVENTION

1. Field of the Invention

The present invention relates to a plasma CVD apparatus for forming a thin film in the semiconductor, liquid crystal, optical disc or like technological fields, and particularly relates to a plasma CVD apparatus using a reaction chamber constituted by a conductor such as metal.

2. Description of the Related Art

As methods of forming a thin film on a substrate, there are known a sputtering method using a sputtering phenomenon in a decompressed state, a vacuum evaporation method using an evaporation phenomenon, a CVD (Chemical Vapor Deposition) method such as a plasma CVD method using low temperature gas decomposition by plasma, a thermal CVD method using heat decomposition of a gas, and a photo CVD method for decomposing a gas by energy of shortwave light or ultraviolet rays, and the like. In addition, research and development has been undertaken with respect to combined techniques and applied techniques of the aforementioned methods, and such techniques have been implemented in actual manufacturing methods.

Among the foregoing thin film forming techniques, the plasma CVD method is characterized in that direct current or high frequency voltage is applied to a reaction gas in a decompressed state, and the reaction gas is decomposed by glow discharge to deposit a film on a substrate. In the thin film formation by this method, gas can be decomposed at a relatively low temperature (500° C. or less) by plasma energy such as high electron temperature of several eV in the plasma, and films of various compositions with high purity can be formed by using vacuum and by changing the kind of gas. Thus, the plasma CVD method is used in various fields such as the semiconductor field, the liquid crystal field, the optical disk field, and the magnetic disk field. magnetic disk field.

It is well known that to use a batch type plasma CVD apparatus in which a plurality of substrates are processed at the same time to form a thin film on a substrate.

However, in the case of the batch process, even if substrates are processed at the same time, characteristics of thin films slightly fluctuate in the respective substrates. Thus, repeated or consistent precision is poor and unevenness among substrates is large, so that the batch process has not been able to fulfill the desire for high precision in a thin film.

In addition, since a plurality of (about four to eight pieces) substrates are processed at the same time, it has been necessary to provide a substrate holder on which the substrates are mounted and are moved together with the substrates. This substrate holder is removed to the outside of the plasma CVD apparatus when film growth on the substrates is completed, the next batch of substrates is mounted on the substrate holder, and then the substrate holder is again processed in the apparatus.

Thus, since the process of heating in vacuum and placing in atmospheric pressure at room temperature is repeated, a so-called peeling phenomenon occurs in which a film attached to the substrate holder is peeled off.

Because of the foregoing reason, the batch process has not been used recently in not only the plasma CVD apparatus but also in almost entire fields including, for example, thin film etching. Instead, single wafer processing type apparatus has been used.

The single wafer processing type is a system characterized in that a substrate holder moving together with substrates is not used, but, rather, substrates are processed one by one, and only the substrate is moved. A conventional plasma CVD apparatus using this system will be described with reference to FIGS. 2 and 3.

FIG. 2 is a top view showing a single wafer processing type plasma CVD apparatus, and a chamber 201 is a load chamber in and out of which a substrate is carried. Chambers 202 to 206 become reaction chambers.

A plurality of substrates to be processed are set in the load chamber 201 by a cassette or the like. After the substrates are set in the load chamber 201, the chamber is decompressed. When the chamber is decompressed to a sufficient pressure, a gate valve 210 between the load chamber 201 and a common chamber 207 is opened. A substrate carrying means 208 disposed in the common chamber 207 carries one substrate among a plurality of substrates set in the cassette in the load chamber 201 from the load chamber 201 into the common chamber 207. FIG. 2 shows the state where the substrate has been carried, and a substrate 209 is carried into the reaction chamber in which a thin film is formed. The substrate 209 is carried by the substrate carrying means 208 into the reaction chamber.

The common chamber 207 is connected to the respective reaction chambers 202 to 206 and the load chamber 201 through the respective gate valves 210. When the substrate 209 is carried in and out of the respective chambers, the gate valve of that chamber is opened. The load chamber 201, the respective reaction chambers 202 to 206, and the common chamber 207 are evacuated by vacuum exhausting means, respectively.

As to thin film formation, there are various types such as a lamination type (P-layer, I-layer, and N-layer, etc.)for use, for example, in an amorphous solar cell, and a single layer type for use, for example, in a protective film for a semiconductor. Thus, the processes in the respective chambers are different according to the kinds of films to be formed, the type of lamination, and the like.

FIG. 3 is a sectional view taken along line A—A of FIG. 2 and showing the common chamber 207 and the reaction chamber 204.

An electrode 211 and a substrate holder 212 are disposed in the reaction chamber 204. The electrode 211 is connected to a power source 213, and the substrate holder 212 and the reaction chamber 204 are grounded. The substrate holder 212 is equipped with a heater (not shown) for heating a substrate.

This substrate holder 212 is disposed inside the reaction chamber 204 contrary to the foregoing batch type, and is not moved together with the substrate 209.

The substrate 209 is placed on the substrate holder 212 from the common chamber 207, and a reaction gas is introduced through an introduction pipe 214. Then voltage is applied to the electrode 211 to generate plasma in a space 215 so that a thin film is formed on the substrate.

The substrate 210 on which a thin film has been formed, is again carried by the carrying means 208 in the common chamber 207 from the reaction chamber 204 into the common chamber 207, and is subjected to a next process. Another substrate is carried in the reaction chamber 204 and thin film formation is performed in the same manner. In these sequential processes, only the substrate is moved.

Incidentally, reference numerals 217 and 218 denote vacuum exhausting means, which maintain the inside of the common chamber and the reaction chamber in a decompressed state. The exhausting means is generally independently provided in the respective chambers.

The reaction cambers 203 to 206 also have the same structure as the reaction chamber 202, and the reaction chambers are selectively used according to the kind and thickness of a film to be formed. For example, a silicon film is formed in the reaction chamber 202, a silicon oxide film is formed in the reaction chamber 203, and a silicon nitride film is formed in the reaction chamber 204.

Alternatively, the same process of laminating a silicon nitride film, a silicon film, and a silicon nitride film is performed in the respective reaction chambers, so that the total throughput, that is, the so-called producibility is improved.

Of course, if the kind of film to be formed in each chamber is determined so as to suppress impurities to the highest degree, each film can be sequentially formed without mixture of impurities, so that it is also possible to increase the efficiency of production.

In the structure of the above-mentioned plasma CVD apparatus, the respective chambers are mainly composed of a conductor such as metal, for example, aluminum or stainless steel. With respect to materials for a chamber of the plasma CVD apparatus, although it is known that quartz or alumina as an insulator may be used other than metal, such a material is not used for a single wafer processing type apparatus. The reason is as follows.

In the case of the single wafer processing type plasma CVD apparatus, since substrates are processed one at a time, it is necessary to provide a plurality of reaction chambers to increase the producibility. If a plurality of reaction chambers are provided, a plasma CVD apparatus inevitably becomes large. Thus, it is necessary to use a material having strength. In the case of a material such as quartz or aluminum, although it has strength, it is apt to be damaged. A material of a vacuum chamber is so subtle that even if a flaw such as a hairline crack is present, vacuum can not be maintained. In addition, since the apparatus becomes large and complicated, it is necessary to use a material which is easily workable and has high working precision. Moreover, it is preferable that the material be as inexpensive as possible.

To satisfy the above described conditions reaction chamber, presently are often made of a metal material such as aluminum, aluminum alloy, or stainless steel.

In the case where a thin film is formed by the foregoing single wafer processing type plasma CVD apparatus, a reaction gas to be decomposed extends not only to a substrate but also to the entirety of a reaction chamber. In a thermal CVD and the like, since the entirety of a reaction chamber is heated, films are formed over the entirety of the reaction chamber, as well as on the substrate. In the case of the plasma CVD method, although it is ideal that a film is formed only on the substrate where plasma is generated, films are also formed at places other than the substrate. That is, since the plasma 215 extends also in the space other than the vicinity of the substrate 209, films are formed also on the exposed portions such as the surface of the electrode 211 and the inner wall of the reaction chamber.

The aforementioned occurs because, since the reaction chamber is made of a metal material, that is, a conductor, plasma is not generated only in a space between the electrode and the substrate holder, but extends beyond this space. Contrary to the substrate holder of a batch type plasma CVD apparatus, the films formed on portions other than the substrate are not exposed to the atmosphere, or are not subjected to the repetition of a cycle of room temperature and high temperature, so that the films do not immediately peel off.

However, when film formation is continued, the films start to peel off as well. Then these films become particles, flakes or the like and fall onto the substrate or the bottom of the reaction chamber.

Thus, it is necessary to periodically remove the films formed and deposited on places other than the substrate after several sequences of film formation are carried out and before the films start to peel off. The removal of the films is carried out by introducing an etching gas into the reaction chamber to form plasma so that the films are etched.

At the film formation, there is also a terrible case such that unnecessary discharge such as arc discharge occurs also in a space near the electrode 211 and between the electrode 211 and the inner wall of the reaction chamber, for example, in the space designated by 216 in FIG. 3, and the thickness of a film formed on the inner wall becomes thick, so that the film becomes easy to peel off.

The inner wall of the reaction chamber is made relatively smooth in its surface. The objects thereof are to suppress the degassing of the wall so that impurities are decreased, as well as to prevent arc discharge, and the like. Actually, the wall surface is made to be close to a mirror surface by buff polishing with #400 or more, electrolytic polishing, combined electrolytic polishing, or the like. A film attached to the smooth surface has poor adhesion and easily peels off. The peeled film becomes particles or flakes, falls onto the reaction chamber, and is deposited. These deposits, which once peeled off and became particles or flakes, are hard to remove by plasma etching than a film-like substance attached to the inner wall at the film formation.

Actually, the deposits can not be completely removed. The reason why they can not be completely removed, is not clarified theoretically. However, as an empirical law, although a film-like substance may be etched, a solid substance such as particles or flakes can not be completely etched.

Thus, it is necessary to carry out cleaning of the reaction chamber considerably before a film that is attached to a place other than a substrate peels off. Thus, with respect to the ratio of film forming hours contributing to production to etching hours not contributing to production in hours of operation of an apparatus, the ratio of the hours contributing to production is decreased.

If unevenness is provided on the surface of the reaction chamber, it is possible to prevent the film from easily peeling off. However, with a surface area that becomes large, it takes a more time to achieve evacuation, and the amount of gas released from the uneven surface having the increased surface area is increased. Thus, the method of providing the unevenness is contrary to the original object to form a thin film having high purity by using a vacuum apparatus.

SUMMARY OF THE INVENTION

The present invention has been made to overcome the foregoing problems. That is, an object of the present invention is to provide a plasma CVD apparatus in which unnecessary discharge such as arc discharge is prevented, the amount of particles due to peeling of films attached to a reaction chamber is decreased, and the percentage of a time contributing to production in hours of operation of the apparatus is increased, while the enlargement of the apparatus and easy workability can be maintained.

According to an aspect of the present invention, a plasma CVD apparatus comprises a conductive reaction chamber maintained in a decompressed state; an electrode for supplying electric energy into the reaction chamber; a substrate holder capable of holding a substrate opposite to the electrode; a gas system for supplying a gas into the reaction chamber; and an exhaust system for exhausting the reaction chamber, and is characterized in that plasma is generated in a space surrounded by the electrode, the substrate holder, and an insulator.

In the above structure, the plasma CVD apparatus is characterized in that the insulator is alumina.

According to another aspect of the present invention, a plasma CVD apparatus comprises a load chamber, a common chamber, and a reaction chamber respectively made of a conductor and maintained in a decompressed state; carrying means disposed in the common chamber and for carrying a substrate in and out of the reaction chamber; an electrode for supplying electric energy into the reaction chamber; a substrate holder for holding the substrate opposite to the electrode; a gas system for supplying a gas into the reaction chamber; and an exhaust system for exhausting the reaction chamber, wherein plasma is generated in a space surrounded by the electrode, the substrate holder, and an insulator, and the apparatus is characterized in that the insulator becomes a stopper when the substrate holder is worked and is stopped.

In the above structure, the plasma CVD apparatus is characterized in that the insulator is made of alumina.

DETAILED DESCRIPTION OF THE PREFERRED EMBODIMENTS

Figure 1:
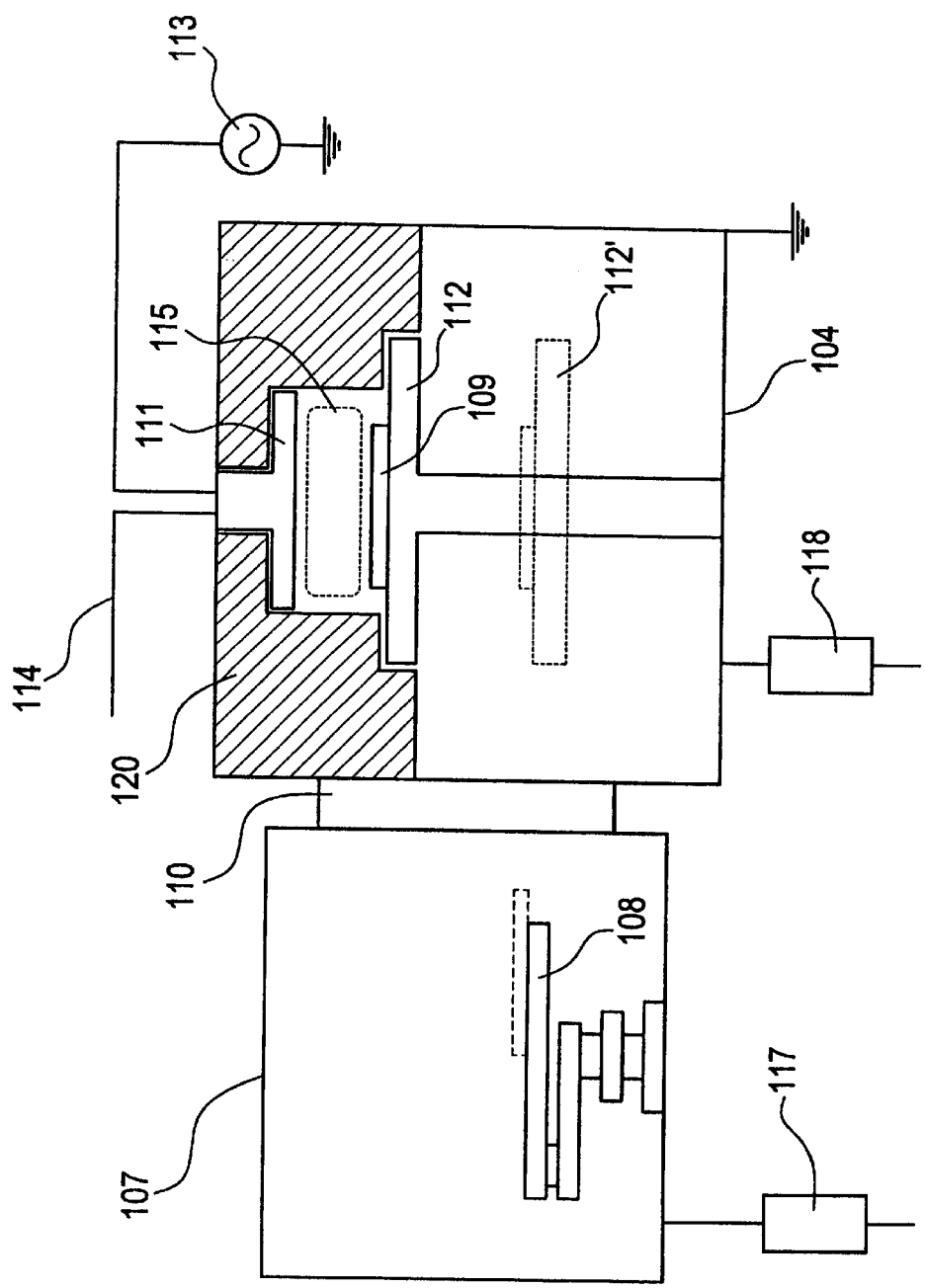
FIG. 1 is a sectional view showing a common chamber and a reaction chamber of a plasma CVD apparatus of the present invention.
Figure 2:
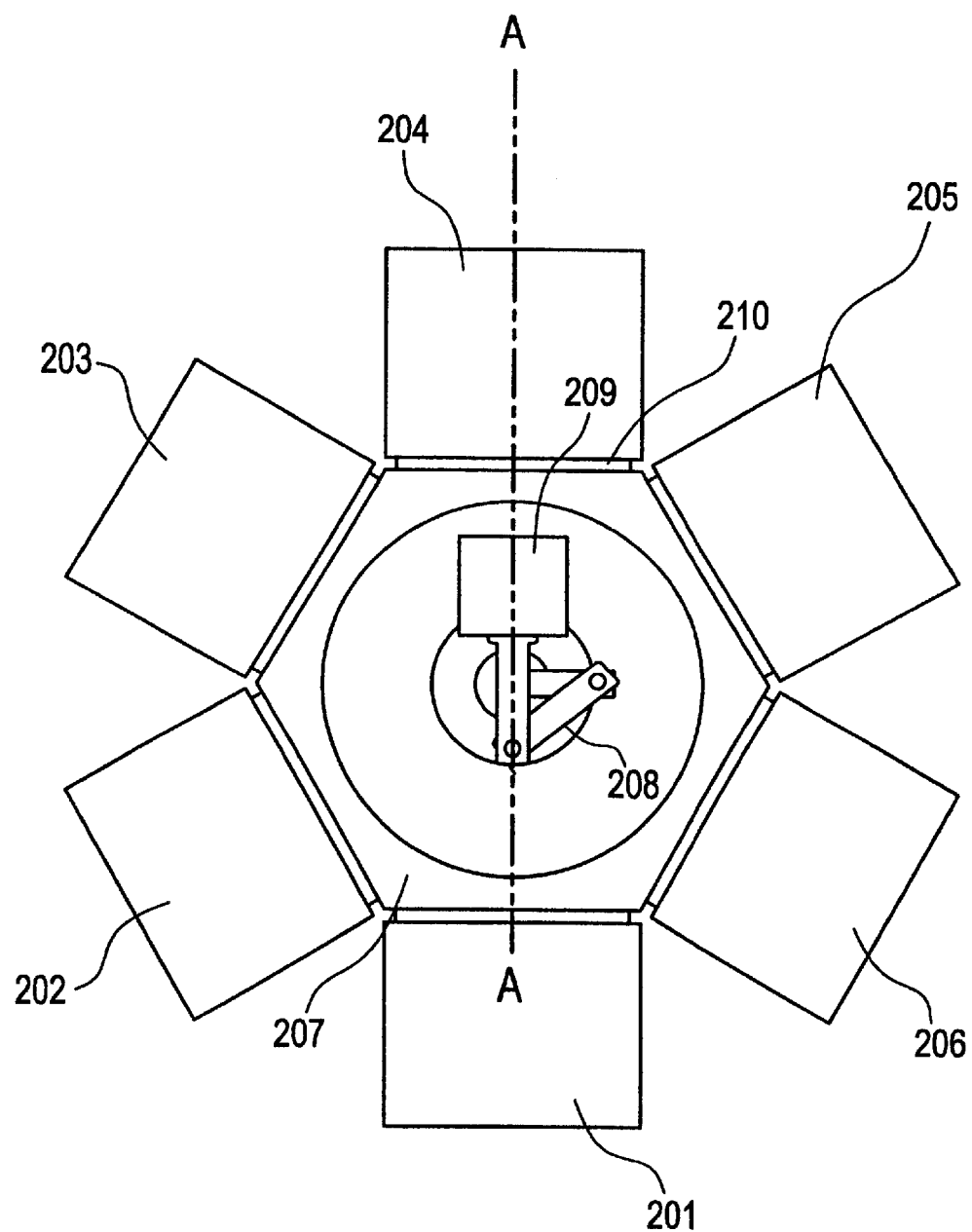
FIG. 2 is a top view showing a single wafer processing type plasma CVD apparatus.
Figure 3:
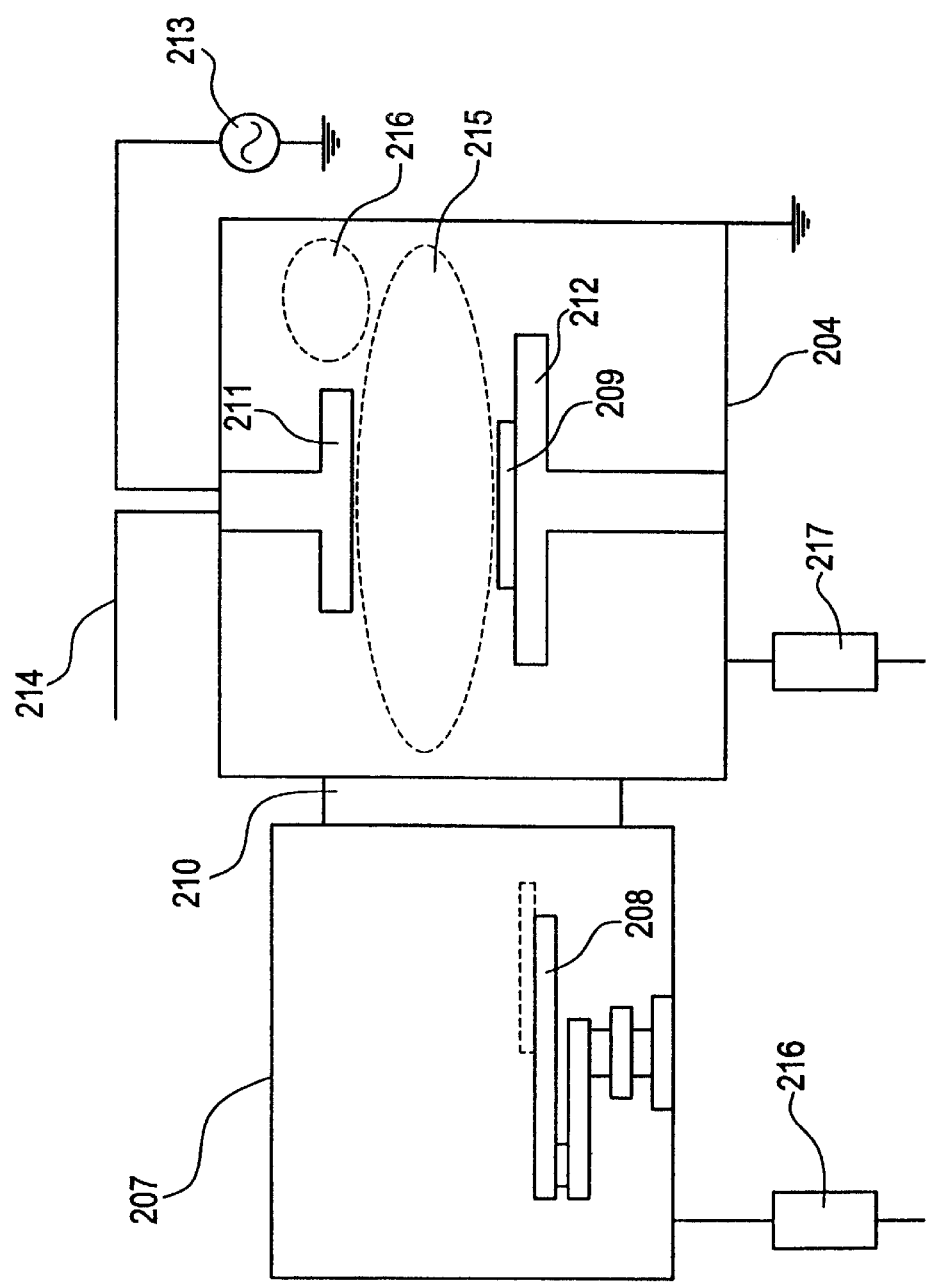
FIG. 3 is a sectional view showing a common chamber and a reaction chamber of a conventional plasma CVD apparatus.

FIG. 1 shows a plasma CVD apparatus of the present invention. FIG. 1 is a sectional view showing a common chamber 107 and one reaction chamber 104. The CVD apparatus is constituted by a load chamber, a common chamber, and a plurality of reaction chambers as in, for example, the single wafer processing type shown in FIG. 2.

The common chamber 107 and the reaction chamber 104 are made of a metal material because of the reason described before. They are connected to each other through a gate valve 110.

In the reaction chamber 104, an electrode 111 and a substrate holder 112 are disposed. The electrode 111 is connected to a power source 113, and the substrate holder 112 and the reaction chamber 104 are grounded. The substrate holder is equipped with a heater (not shown) for heating a substrate.

Reference numerals 117 and 118 denote vacuum exhausting means, and maintain the inside of the common chamber and the reaction chamber in a decompressed state, respectively. Reference numeral 114 denotes a pipe for introducing a reaction gas into the reaction chamber 104. In the case of FIG. 1, the electrode 111 is of a mesh-type, and a reaction gas passes through the introduction pipe 114 and is introduced through the electrode 111 into the reaction chamber 104.

As shown in FIG. 1, an insulator 120, for example, alumina is attached. In this state, when a voltage is applied to the electrode 111, generated plasma 115 is surrounded by the electrode 111, the substrate holder 112, and the insulator 120.

Thus, the plasma does not extend over the space between the electrode and the substrate holder by means of the insulator 120, and it is possible to prevent unnecessary discharge from occurring between the electrode 111 and the reaction chamber 104.

A substrate 109 is carried in and out of the reaction chamber 104 from the common chamber 107 by carrying means 108. At the time of carrying the substrate, the substrate holder 112 is positioned below as indicated by a dotted line 112' in FIG. 1. By so doing, it is possible to place the substrate 109 by the carrying means 108 while the insulator 120 does not become an obstacle.

Further, when a film is formed on the substrate 109, in order to make the plasma surrounded by the electrode 111, the substrate holder 112, and the insulator 120, the substrate holder 112 is raised. At this time, the insulator 120 is designed to become a stopper so that the substrate holder 112 is stopped. By doing so, it is possible to preclude the possibility that the substrate holder 112 is excessively raised so that the substrate 109 comes in contact with the electrode 111, whereby safety in automation of the apparatus is improved.

As described above, since the plasma 115 does not extend beyond a prescribed region, plasma density is increased, and unnecessary discharge such as arc discharge does not occur. Thus, a film growth speed of a film formed on the substrate 109 is increased.

At the film formation, films are formed mainly on the surface of the electrode 111 and the surface of the insulator 120. However, since the surface of the insulator 120 has unevenness, the film attached thereto has good adhesion as compared with that attached to metal, and becomes hard to transform into particles or flakes which fall down. Thus, it is possible to decrease the amount of the particles and flakes, and cleaning of the reaction chamber by plasma etching becomes easy.

Further, since the films are mainly formed on the surface of the electrode 111 and the surface of the insulator 120, and are hardly formed on the reaction chamber itself, the area to be cleaned becomes narrow. Further, as described above, since the plasma does not extend, the plasma density is increased.

According to the above reasons, a time for cleaning is shortened, so that it is possible to increase the percentage of a time contributing to production in hours of operation of the apparatus.

Preferred embodiments of the present invention will next be described specifically with reference to the drawings.

Embodiment 1

Figure 4:
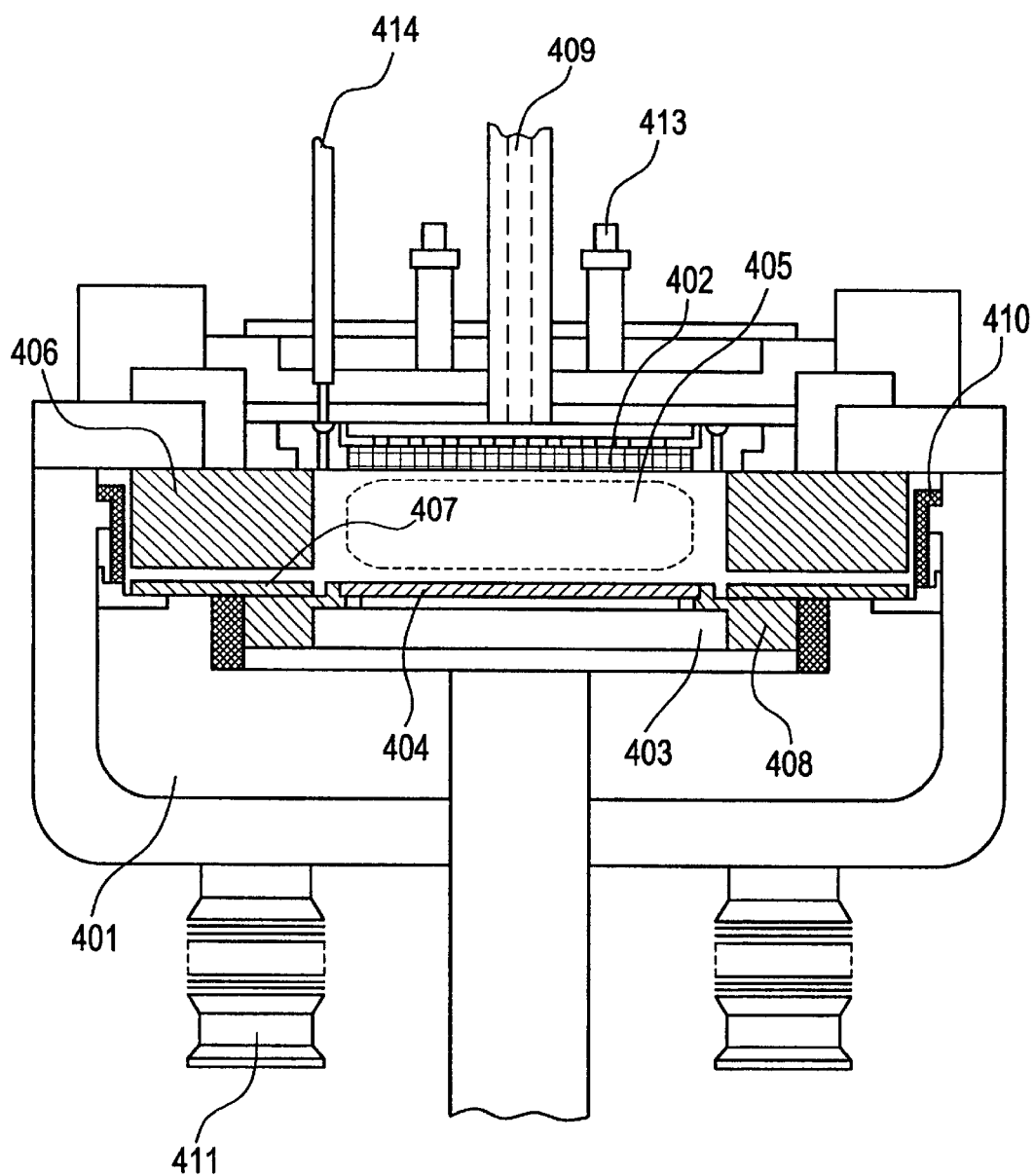
FIG. 4 is a sectional view showing a reaction chamber of a plasma CVD apparatus of an embodiment of the present invention.

In this embodiment, the case where a silicon nitride film is formed on a substrate is used as an example, and a single wafer processing type plasma CVD apparatus of this embodiment will be described. FIG. 4 is a sectional view showing a reaction chamber of the plasma CVD apparatus of this embodiment.

In FIG. 4, an electrode 402 and a substrate holder 403 are disposed in a reaction chamber 401. The electrode 402 is of a mesh-type, and a reaction gas passes through an introduction pipe 409, and is introduced into the reaction chamber through the mesh electrode 402.

Insulators, for example, alumina 406, 407 are disposed between a space 405, which is defined between the electrode 402 and the substrate holder 403, and the reaction chamber 401.

A portion designated by 410 is formed of quartz. The quartz 410 is employed for the following reason. The reaction gas comes in contact with the wall of the reaction chamber through the space between the insulators 406 and 407. Thus, a film is also formed on the surface of the wall of the reaction chamber made of aluminum with which the gas comes in contact. Since this film is formed on the aluminum, it becomes particles. In order to prevent this, the quartz 410 is disposed.

Reference numeral 411 denotes an exhaust pipe, which is connected to a turbo-molecular pump and a rotary pump in this order, and which maintains the inside of the reaction chamber in a decompressed state. In this embodiment, the inside of the reaction chamber is first set to 0.3 torr.

Next, in the state where the distance between the substrate holder 403 and the electrode 402 is 65 mm, a glass substrate 404 is disposed on the substrate holder 403 by a carrying means (not shown). In this state, the insulators 406 and 407 do not become obstacles against setting of the substrate 404.

Then the substrate holder is raised so that the distance between the substrate holder 403 and the electrode 402 is made 15 to 25 mm, whereby the state shown in the drawing is obtained. In this embodiment, the distance is set to 20 mm.

As described above, the substrate holder 403 is moved up and down. When the substrate 404 is placed, the substrate holder is placed in the lower state so that the substrate holder 403 is sufficiently separated from the insulator 407 and the substrate can be smoothly placed. When a film is formed on the substrate, the substrate holder is raised as shown in FIG. 4.

The position of the substrate (distance between the substrate and the electrode) can be adjusted. The insulator 407 functions also as a stopper when the substrate holder 403 is raised, so that the insulator improves the safety when the substrate holder 403 is raised.

Although not shown, a heater for heating the substrate 404 is provided in the substrate holder 403.

A mixed gas of silane, ammonium, nitrogen, and hydrogen is introduced into the reaction chamber through the mesh electrode 402 at a flow rate of silane/ammonium/nitrogen/hydrogen=30/150/250/100 SCCM. Under the condition of a total pressure of 0.2 to 1 torr, an RF power of 100 to 300 W is applied to the electrode 402 from a power source (not shown), to generate plasma in the space 405. The substrate temperature at this time is set at 250 to 400° C. In this embodiment, the total pressure is 0.5 torr, the RF power is 200 W, and the substrate temperature is 325° C.

Since the size of the electrode is 200 mm$\phi$, the voltage applied to the electrode is about 0.3 to 1 W/cm$^2$. The plasma generated at this time does not extend by means of the insulators 406 and 407, and arc discharge or the like does not occur between the wall of the reaction chamber and the electrode.

In the manner described above, a silicon nitride film is formed. The film growth speed of a silicon nitride film under the conditions of this embodiment is about 1,400 Å/min.

Since the film growth speed in the case where a film is formed by a conventional plasma CVD apparatus is about 300 Å/min, it would be understood that a film growth speed is extremely increased.

As the insulators 406 and 407 are placed as parallel as possible to each other, a film having good film quality can be obtained. Especially, if a film of good film quality is desired to be obtained, it is appropriate that the distance between the insulators is made rather long. In this embodiment, the distance is made 3 to 5 mm.

Silicon nitride films are also formed on the surfaces of the insulators 406 and 407 at the side of the space 405. However, films are hardly formed on the surface of the reaction chamber.

Since these films are formed on the surfaces of alumina, they tend not to fall down as particles so that the amount of particles or the like in the reaction chamber is decreased.

After film formation is carried out to some extent, and some films are formed on the surfaces of the insulators 406 and 407, cleaning is carried out. In this embodiment, when the thickness of a film attached to the insulators becomes 10 to 20 μm, cleaning is carried out.

As an etching gas, a mixed gas of nitrogen fluoride and nitrogen is used. The mixed gas of nitrogen fluoride/nitrogen=80/300 SCCM is flown in the reaction chamber and the total pressure is made about 0.2 to 1 torr. In this embodiment, the total pressure is 0.5 torr.

The distance between the substrate holder 403 and the electrode is made about 50 mm. Silicon nitride films are attached also to the respective surfaces of the insulators 408 and 407. In order to etch these, the substrate holder is lowered, and the space between the insulators 407 and 408 is secured.

Then radio frequency power of 100 to 200 W is applied to carry out cleaning. In this embodiment, the cleaning is carried out at 200 W. In this case, etching is ended in about 40 minutes. In view of the fact that it took conventionally 5 to 6 hours to carry out cleaning, the time for etching according to this embodiment is shortened to about $\frac{1}{8}$–$\frac{1}{9}$ of the conventional cleaning time.

As described above, the surface of the insulator such as alumina has more unevenness than the surface of the inner wall of the reaction chamber, that is, the surface of metal. Thus, the attached film is hard to peel off, so that it is possible to decrease the amount of particles and the like falling to the substrate and the bottom of the reaction chamber, and cleaning is thus simplified.

Further, since the insulators 406 and 407 are disposed, it is possible to prevent the plasma from extending beyond a desired region. Thus, unnecessary discharge such as arc discharge does not occur between the electrode and the inner wall of the reaction chamber, and the plasma density is also increased.

In addition, since films are hardly formed on the wall of the reaction chamber, but they are formed on the insulator, the electrode and the like, an area to be cleaned is narrow.

As a result, cleaning becomes relatively easy, a time for cleaning can be shortened, and the percentage of time contributing to production in hours of operation of the apparatus can be increased.

Embodiment 2

An example in which a silicon oxide film is formed on a substrate by using the apparatus shown in FIG. 4 will be described.

In the apparatus shown in FIG. 4, a reaction gas of TEOS/oxygen=10/300 SCCM is introduced into the reaction chamber, and the total pressure is made about 0.5 to 1 torr. In this embodiment, the total pressure is made 0.75 torr.

Under the conditions that the substrate temperature is 300 to 400° C., RF power is 150 to 300 W, and the distance between a substrate and the electrode is 10 to 15 mm, a silicon oxide film is formed on the substrate. In this embodiment, the substrate temperature is 350° C., RF power is 200 W, and the distance is 13.5 mm.

The film growth speed in these conditions is about 2,000 to 2,300 Å/min, which is about 3 times that of a conventional apparatus.

Cleaning is carried out in the same way as described in embodiment 1. However, the total pressure in the reaction chamber is made about 1 torr, and the distance between the substrate holder 403 and the electrode is made 50 to 60 mm.

In this embodiment, an etching time is greatly shortened to 20 to 40 minutes.

As described above, there can be obtained a plasma CVD apparatus in which unnecessary discharge such as arc discharge does not occur while a conductive material is used, which is advantageous to enlargement and easy workability. Further, since films are not attached to the inner wall of a reaction chamber but are attached to the surface of an insulator, it is possible to decrease the amount of particles and the like in the reaction chamber.

Moreover, a cleaning time is shortened, and the percentage of a time contributing to production in hours of operation of the apparatus can be increased.

What is claimed is:

1. A method for fabricating a semiconductor device comprising:

preparing a CVD apparatus having a plurality of chambers including at least a load chamber, a common chamber, and a reaction chamber;

holding a substrate on a substrate holder opposite to an electrode in the reaction chamber, wherein at least one electrical insulator is located so as to surround a space between said electrode and substrate holder; and supplying electric energy into the reaction chamber;

wherein plasma is generated in said space surrounded by the electrode, the substrate holder, and said insulator, and wherein said insulator prevents said plasma from extending to walls of the reaction chamber.

2. A method according to claim 1 wherein the insulator comprises alumina.

3. A method for fabricating a semiconductor device comprising:

preparing a CVD apparatus having a plurality of chambers including at least a load chamber, a common chamber, and a reaction chamber;

holding a substrate on a substrate holder opposite to an electrode in the reaction chamber, wherein at least one electrical insulator is located so as to surround a space between said electrode and substrate holder; and generating plasma between said electrode and said substrate holder so as to extend only in said space surrounded by the electrode, the substrate holder, and said insulator.

4. A method according to claim 3 wherein the insulator comprises alumina.

5. A method for fabricating a semiconductor device comprising:

preparing a CVD apparatus having a plurality of chambers including at least a load chamber, a common chamber, and a reaction chamber;

holding a substrate on a substrate holder opposite to an electrode in the reaction chamber, wherein at least one electrical insulator is located so as to surround a space between said electrode and substrate holder;

supplying electric energy into the reaction chamber; and then cleaning the reaction chamber by applying radio frequency power to the electrode in an atmosphere containing $NF_3$, wherein plasma is generated in said space surrounded by the electrode, the substrate holder, and said insulator, and wherein said insulator prevents said plasma from extending to walls of the reaction chamber.

6. A method according to claim 5 wherein the insulator comprises alumina.

7. A method according to claim 5 wherein the radio frequency power is 100 to 200 W.

8. A method for fabricating a semiconductor device comprising:

preparing a CVD apparatus having a plurality of chambers including at least a load chamber, a common chamber, and a reaction chamber;

holding a substrate on a substrate holder opposite to an electrode in the reaction chamber, wherein at least one electrical insulator is located so as to surround a space between said electrode and substrate holder;

generating plasma between said electrode and said substrate holder so as to extend only in said space surrounded by the electrode, the substrate holder, and said insulator; and then cleaning the reaction chamber by applying radio frequency power to the electrode in an atmosphere containing $NF_3$ and $N_2$.

9. A method according to claim 8 wherein the insulator comprises alumina.

10. A method according to claim 8 wherein the radio frequency power is 100 to 200 W.

* * * * *